United States Patent
Maruno et al.

(10) Patent No.: US 8,703,382 B2
(45) Date of Patent: Apr. 22, 2014

(54) PHOTOSENSITIVE RESIN COMPOSITION FOR FLEXOGRAPHIC PRINTING HAVING EXCELLENT SOLVENT RESISTANCE

(75) Inventors: Masanori Maruno, Kashiba (JP); Jun Yoshida, Nabari (JP); Kenya Yamashita, Kashiba (JP); Yukikazu Nobuhara, Ichihara (JP)

(73) Assignee: Nippon Soda Co., Ltd., Tokyo (JP)

( * ) Notice: Subject to any disclaimer, the term of this patent is extended or adjusted under 35 U.S.C. 154(b) by 111 days.

(21) Appl. No.: 13/259,605

(22) PCT Filed: Apr. 8, 2010

(86) PCT No.: PCT/JP2010/002568
§ 371 (c)(1),
(2), (4) Date: Sep. 23, 2011

(87) PCT Pub. No.: WO2010/116743
PCT Pub. Date: Oct. 14, 2010

(65) Prior Publication Data
US 2012/0015296 A1  Jan. 19, 2012

(30) Foreign Application Priority Data
Apr. 10, 2009  (JP) ................. 2009-096180

(51) Int. Cl.
| G03F 7/00 | (2006.01) |
| G03F 7/26 | (2006.01) |
| G03C 1/00 | (2006.01) |
| B41M 5/00 | (2006.01) |
| B41N 1/00 | (2006.01) |

(52) U.S. Cl.
USPC ............. 430/270.1; 430/281.1; 430/306; 430/495.1; 101/453; 101/463.1

(58) Field of Classification Search
USPC ...................................... 430/270.1
See application file for complete search history.

(56) References Cited

U.S. PATENT DOCUMENTS
2009/0068593 A1   3/2009  Fujiwara et al.

FOREIGN PATENT DOCUMENTS

| EP | 1 811 336 A1 | 7/2007 |
| EP | 2 017 087 A1 | 1/2009 |
| JP | 06-194833 A * | 7/1994 |
| JP | A-06-194833 | 7/1994 |
| JP | A-10-104833 | 4/1998 |
| JP | A-2000-010280 | 1/2000 |
| JP | A-2000-155418 | 6/2000 |
| JP | A-2000-181060 | 6/2000 |

(Continued)

OTHER PUBLICATIONS

Nippon Soda Ltd Co. "TE-2000" 2012 (pp. 1-6).*

(Continued)

Primary Examiner — Chanceity Robinson
(74) Attorney, Agent, or Firm — Oliff PLC

(57) ABSTRACT

A photosensitive resin composition for flexographic printing having excellent resistance to an ink comprising an organic solvent and an emulsion ink used in flexographic printing, for example, a UV-curable ink or an ink using a vegetable oil or light naphtha and having excellent suitability for printing applications such as image reproducibility and print durability. The photosensitive resin composition for flexographic printing includes, at least, (a) one or more thermoplastic elastomers, (b) an acrylic-terminated liquid polybutadiene containing 1,2-bonds in an amount of 80% or more, (c) a photopolymerizable unsaturated monomer having at least one or more ethylenically unsaturated groups, and (d) a photopolymerization initiator.

16 Claims, 1 Drawing Sheet

(56) References Cited

FOREIGN PATENT DOCUMENTS

| JP | A-2001-215697 | 8/2001 |
| JP | A-2001-337445 | 12/2001 |
| JP | 2002196492 A * | 7/2002 |
| JP | A-2002-196492 | 7/2002 |
| JP | A-2005-146063 | 6/2005 |
| JP | A-2005-257727 | 9/2005 |
| JP | A-2006-003570 | 1/2006 |
| JP | 2009006601 A * | 1/2009 |
| JP | A-2009-006601 | 1/2009 |
| WO | WO 2006/120935 A1 | 11/2006 |

OTHER PUBLICATIONS

Aug. 13, 2012 European Search Report issued in European Patent Application No. EP 10 76 1447.1.
International Search Report issued in Application No. PCT/JP2010/002568; Dated May 11, 2010 (With Translation).
International Preliminary Report on Patentability issued in Application No. PCT/JP2010/002568; Dated Nov. 15, 2011.

* cited by examiner

PHOTOSENSITIVE RESIN COMPOSITION FOR FLEXOGRAPHIC PRINTING HAVING EXCELLENT SOLVENT RESISTANCE

TECHNICAL FIELD

The present invention relates to a photosensitive resin composition for flexographic printing and a photosensitive resin plate material for flexographic printing, and specifically to a photosensitive resin composition for flexographic printing having resistance to an ink comprising an organic solvent, for example, an emulsion ink, a UV-curable ink, or an ink using a vegetable oil or light naphtha, excellent image reproducibility and print durability, and transparency, and to a photosensitive resin plate material for flexographic printing in which the photosensitive resin composition for flexographic printing is laminated.

The present application claims priority to Japanese Patent Application No. 2009-096180 filed on Apr. 10, 2009, the contents of which are incorporated by reference herein.

BACKGROUND ART

As described in Patent Documents 1 and 2, a photosensitive resin composition for flexographic printing generally contains a thermoplastic elastomer, a photopolymerizable unsaturated monomer, a plasticizer, and a photopolymerization initiator. A structure for a flexographic printing plate generally comprises a support such as a polyester film, the above photosensitive resin composition provided on the support, and a slip layer or a protective layer for the purpose of preventing adhesion with a negative film or a UV shielding layer comprising an infrared-susceptible substance which can be ablated by an infrared laser provided on the photosensitive resin composition. Making a flexographic printing plate from such a photosensitive resin plate material for a flexographic printing plate generally includes first subjecting the whole surface to ultraviolet exposure through the support (back exposure) to provide an even thin cured layer (floor layer), then directly subjecting the surface of the photosensitive resin layer to image exposure (relief exposure) through a negative film or from above the UV shielding layer in which a photomask has been formed by an infrared laser, and washing an unexposed part with a developing solvent or thermally melting the unexposed part followed by absorbing and removing it with an absorption layer followed by post-processing exposure.

General printing using a photosensitive resin plate for flexographic printing is performed by supplying, using an ink supply roll or the like, an ink to a projected surface of the recessed and projected resin plate and then bringing the resin plate into contact with an object to be printed to transfer the ink on the projected surface to the object to be printed. The ink for such general flexographic printing includes an aqueous ink, an emulsion ink, and an organic solvent-based ink, for example, a UV-curable ink or an ink using a vegetable oil or light naphtha.

In such flexographic printing that uses an organic solvent for development at the time of platemaking, problems of a photosensitive resin composition were that because of insufficient resistance to an organic solvent-based ink, the printing plate was destroyed during a long-time printing, or the printing plate was swelled and deformed to cause printing of a shape different from the original pattern required for the printing.

With respect to the solvent resistance of such a photosensitive resin composition, several methods have been proposed to overcome the problems as described above.

In order to improve the resistance to UV curable printing inks, Patent Document 3 proposes a photosensitive resin composition comprising at least one elastomer-based binder, a photopolymerizable unsaturated monomer, and a photopolymerization initiator, and if needed, a dye, a pigment, a polymerization inhibitor, an oxidation inhibitor, and a light degradation inhibitor. As examples thereof, Examples in Patent Document 3 show photosensitive resin compositions comprising various binder mixtures of a plastic elastomer-based block copolymer and a different block copolymer, two photopolymerizable monomers, benzyl dimethyl ketal as a photopolymerization initiator, an oxidation inhibitor, and a dye.

Patent Document 4 proposes a photosensitive resin composition comprising an elastomer resin, a hydrogenated terpene resin having a weight average molecular weight of 2000 or less, an amount of unsaturated bonds of 0.5 mol/100 g or less, and a refractive index at 20° C. of 1.497 or more, a photopolymerizable unsaturated monomer, and a photopolymerization initiator, and if needed, a dye, a pigment, a polymerization inhibitor, an oxidation inhibitor, and a light degradation inhibitor. As examples thereof, Examples in Patent Document 4 show photosensitive resin compositions comprising a styrene-isoprene-styrene copolymer, a hydrogenated terpene resin, two photopolymerizable monomers, and benzyl dimethyl ketal as a photopolymerization initiator.

In order to improve the resistance to an ink comprising a solvent or the like, Patent Document 5 proposes a photosensitive resin composition comprising a butyl rubber having an SP value of less than 8.1, a monomer having an ethylenically unsaturated bond, a photopolymerization initiator, and a water-dispersible latex, and if needed, a dye, a pigment, a polymerization inhibitor, an oxidation inhibitor, and a light degradation inhibitor. As examples thereof, Examples in Patent Document 5 show photosensitive resin compositions comprising butyl rubber, polyisoprene rubber, carboxylated nitrile rubber, butadiene rubber, a water-dispersible latex/hydrophilic monomer mixture, three photopolymerizable monomers, and benzyl dimethyl ketal as a photopolymerization initiator.

Patent Document 6 describes a photosensitive resin composition comprising, for example, a styrene-isoprene-styrene block polymer, an ethylenically unsaturated compound obtained by subjecting a system in which a liquid polybutadiene having a hydroxy terminal, acrylic acid, a compound having a phenol structure, and a compound containing at least one of phosphorus, sulfur, nitrogen, and boron are blended to ester interchange at 80 to 90° C. for 4 hours, 1,6-hexanediol dimethacrylate, and a photopolymerization initiator.

Patent Document 7 describes a photosensitive resin composition comprising, for example, a polystyrene-polybutadiene-polystyrene type block copolymer, a conjugated diene-based ethylenic polymer produced from a hydroxy group-containing polybutadiene and acrylic acid, hexamethylene dimethacrylate, and a photopolymerization initiator, and an original plate for flexographic printing using the same.

PRIOR ART DOCUMENTS

Patent Documents

Patent Document 1: Japanese Unexamined Patent Application Publication No. 2001-215697
Patent Document 2: Japanese Unexamined Patent Application Publication No. 2000-181060

Patent Document 3: Japanese Unexamined Patent Application Publication No. 10-104833
Patent Document 4: Japanese Unexamined Patent Application Publication No. 2006-3570
Patent Document 5: Japanese Unexamined Patent Application Publication No. 2005-257727
Patent Document 6: Japanese Unexamined Patent Application Publication No. 2000-10280
Patent Document 7: Japanese Unexamined Patent Application Publication No. 2002-196492

SUMMARY OF THE INVENTION

Object to be Solved by the Invention

Objects of the present invention are to provide a photosensitive resin composition for flexographic printing having excellent resistance to an ink comprising an organic solvent and an emulsion ink, for example, a UV-curable ink or an ink using a vegetable oil or light naphtha and simultaneously satisfying excellent suitability for printing applications such as image reproducibility and print durability, and to provide a photosensitive resin plate material for flexographic printing in which the photosensitive resin composition for flexographic printing is laminated.

Means to Solve the Object

As a result of extensive investigations to solve the above objects, the present inventors have found that the objects can be solved by using a new photosensitive resin composition to be described below, and have come to accomplish the present invention.

Specifically, the present invention relates to the following:
(1) A photosensitive resin composition for flexographic printing comprising component (a): a thermoplastic elastomer, component (b): a (meth)acrylic-modified liquid polybutadiene containing 1,2-bonds in an amount of 80% or more, component (c): a photopolymerizable unsaturated monomer having one or more ethylenically unsaturated groups, and component (d): a photopolymerization initiator;
(2) The photosensitive resin composition for flexographic printing according to (1), comprising from 18.0 to 95.0% by mass of the component (a); from 1.0 to 80.0% by mass of the component (b); from 1.0 to 30.0% by mass of the component (c); and from 0.1 to 10.0% by mass of the component (d);
(3) The photosensitive resin composition for flexographic printing according to (1) or (2), wherein the component (b) is a liquid polybutadiene having a (meth)acrylic-modified polymer terminal and containing 1,2-bonds in an amount of 80% or more;
(4) The photosensitive resin composition for flexographic printing according to any one of (1) to (3), wherein the component (b) has a number average molecular weight of 200 to 100,000 and a viscosity at 45° C. of 4 Pa·s or more; and
(5) A photosensitive resin plate material for flexographic printing, wherein the photosensitive resin composition for flexographic printing according to any one of (1) to (4) is laminated on a support surface.

EXPLANATION OF LETTERS OR NUMERALS

Figure 1:
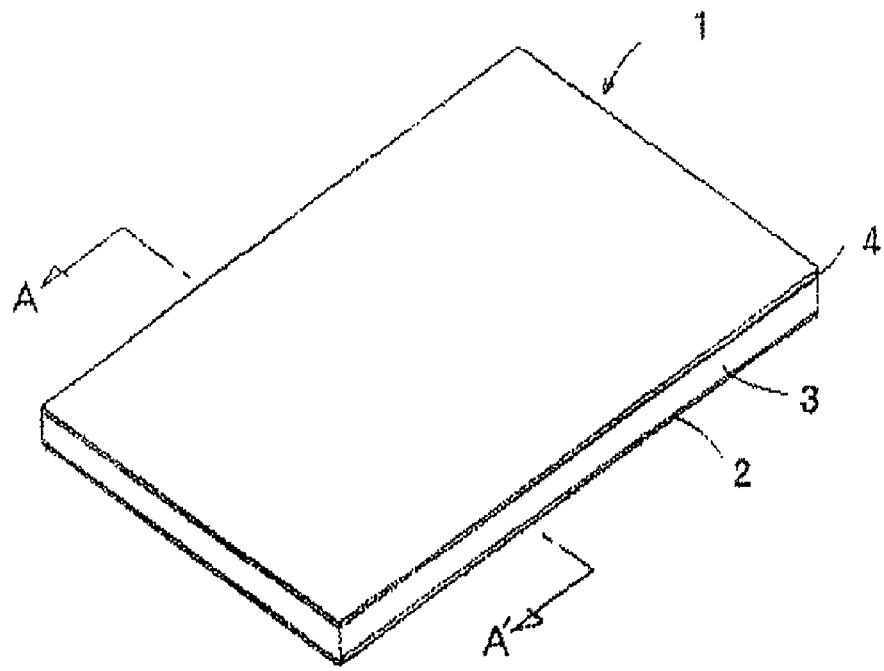
FIG. 1 is a schematic perspective view of the photosensitive resin plate material in the present invention.

1 Photosensitive resin plate material
2 Support
3 Photosensitive resin composition
4 Cover film

MODE OF CARRYING OUT THE INVENTION (1) The Photosensitive Resin Composition for Flexographic Printing First, the photosensitive resin composition for flexographic printing according to the present invention will be described.
The photosensitive resin composition for flexographic printing according to the present invention comprises (a) to (d) shown below as essential ingredients.
Component (a): One or more thermoplastic elastomers
Component (b): A (meth)acrylic-modified liquid polybutadiene containing 1,2-bonds in an amount of 80% or more
Component (c): A photopolymerizable monomer having at least one or more ethylenically unsaturated groups
Component (d): A photopolymerization initiator
(1-1) Component (a)
Specific examples of the thermoplastic elastomer which is the component (a) according to the present invention include a styrene-isoprene-styrene copolymer (hereinafter sometimes referred to as SIS), a styrene-butadiene-styrene copolymer (hereinafter sometimes referred to as SBS) or a styrene-isoprene-butadiene-styrene copolymer (hereinafter sometimes referred to as SIBS), a styrene-ethylene-butylene-styrene copolymer (hereinafter sometimes referred to as SEBS), a styrene-ethylene-propylene-styrene copolymer (hereinafter sometimes referred to as SEPS), and a syndiotactic 1,2-polybutadiene (hereinafter sometimes referred to as RB).

The SIS and SBS used in the present invention are excellent in rubber elasticity and formability/processability, and are easily available. These tri-block copolymers desirably have a number average molecular weight, according to the GPC measurement using polystyrene as a reference material, in the range of from 2,000 to 100,000 for the non-elastomer block and from 250,000 to 1,000,000 for the elastomer block. This is because the performance of the photosensitive resin composition will decrease if the number average molecular weight is outside the above-mentioned range. Specifically, if the molecular weight of the non-elastomer block is too small, cold flow properties will remain in the composition, and if it is too large, rubber elasticity will be impaired. Further, if the molecular weight of the elastomer block is too small, it will be difficult to exhibit rubber elasticity, and if it is too large, cold flow properties will be high.

With respect to the above SIBS, SEBS, and SEPS used in the present invention, these tetra-block copolymers desirably have a number average molecular weight, according to the GPC measurement using polystyrene as a reference material, in the range of from 2,000 to 200,000 for the non-elastomer block and from 250,000 to 2,000,000 for the elastomer block. This is because the performance of the photosensitive resin composition will decrease if the number average molecular weight is outside the above-mentioned range. Specifically, if the molecular weight of the non-elastomer block is too small, cold flow properties will remain in the composition, and if it is too large, rubber elasticity will be impaired. Further, if the molecular weight of the elastomer block is too small, it will be difficult to exhibit rubber elasticity, and if it is too large, cold flow properties will be high.

The RB used in the present invention is an elastomer having a low crystallinity and rich in reactivity, in which the amount of 1,2-bonds is desirably 85% or more and the crystallinity is desirably in the range of from 10 to 50%. If crystallinity is high, it will be hard and will lose rubber elasticity, and if crystallinity is low, physical properties will decrease.

The blending amount of the component (a) in the photosensitive resin composition for flexographic printing according to the present invention is generally preferably from 18.0 to 95.0% by mass, more preferably from 50 to 80% by mass. This is because if it is less than 18.0% by mass, the composition will be inferior in physical strength, and if it exceeds 95.0% by mass, the composition will be inferior in productivity and a desired hardness will not be obtained, and thus neither of the cases is preferred.

(1-2) Component (b)

The component (b) according to the present invention is a liquid polymer having a structure in which one or more methacryloyl groups or acryloyl groups are introduced into a liquid polybutadiene molecule containing 1,2-bonds in an amount of 80% or more, and particularly, a structure in which the functional groups are introduced into polymer molecular terminals is preferred. Specific examples include a homopolymer or a copolymer which contains the following repeating unit of 1,2-bond (1) and the following repeating unit of 1,4-bond (2):

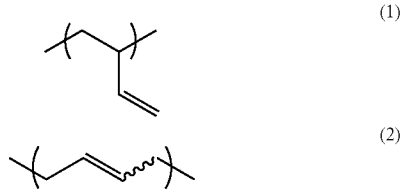

(1)

(2)

(wherein the molar ratio of (1) and (2) is $M(1)/[M(1)+M(2)] \geq 0.8$, wherein $M(1)$ and $M(2)$ represent the number of moles of (1) and (2), respectively; and the wave line in the repeating unit of 1,4-bond (2) shows that it may be a trans-bond or a cis-bond, and the repeating unit of 1,4-bond (2) may include a trans-form, a cis-form, or a mixtures thereof), has a functional group represented by the following formula (3) at one terminal:

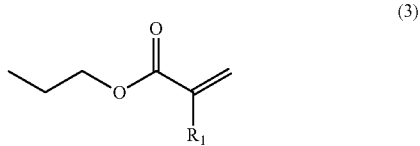

(3)

(wherein $R_1$ represents a hydrogen atom or a methyl group), and has a functional group of the above formula (3) or a residue of a polymerization initiator at the other terminal. Examples of the copolymer include a random copolymer, a block copolymer, and an alternating copolymer.

The component (b) may undergo thermal polymerization or photopolymerization by a peroxide or a photopolymerization initiator because it has at least one or more ethylenically unsaturated groups in the molecular structure thereof. Further, the compatibility with the essential ingredients (a), (c), and (d) is very good.

Further, the component (b) has a number average molecular weight in the range of from 200 to 100,000, preferably from 1000 to 100,000, and has a viscosity at 45° C. of 4 Pa·s or more, preferably 10 Pa·s or more. If the molecular weight is too low, the rubber elasticity after curing of the photosensitive resin composition will be impaired. Further, if the viscosity of the liquid polymer is low, the cold flow properties of the photosensitive resin composition will decrease.

The blending amount of the component (b) is preferably from 1.0 to 80.0% by mass, more preferably from 5.0 to 50.0% by mass. If it is less than 5.0% by mass, crosslinking density will be too low to obtain sufficient solvent resistance, and if it exceeds 50.0% by mass, a desired hardness and rubber elasticity will not be obtained after curing.

The (meth)acrylic-modified liquid polybutadiene containing the 1,2-bonds in an amount of 80% or more, which is the component (b), may be a commercially available one or may be produced by a known method.

Examples of the production method can include allowing a compound having a (meth)acrylic group to react with a hydroxy group of a hydroxy group-containing polybutadiene to introduce a (meth)acrylic group.

Examples of the compound having a (meth)acrylic group include (meth)acrylic acids such as acrylic acid and methacrylic acid and (meth)acrylates such as methyl acrylate, methyl methacrylate, ethyl acrylate, and ethyl methacrylate.

Further, known methods for introducing a (meth)acrylic group include a method of subjecting a (meth)acrylate and a hydroxy group of polybutadiene to dehydration condensation using p-toluenesulfonic acid or the like as a catalyst; a method of subjecting a (meth)acrylate and a hydroxy group of polybutadiene to ester interchange using a titanium catalyst, a tin catalyst, or the like as a catalyst; and a method of reacting a compound having two or more isocyanate groups, a hydroxy group-containing (meth)acrylate such as 2-hydroxyethyl (meth)acrylate, and a hydroxy group of polybutadiene.

(1-3) Component (c)

Specific examples of the component (c) according to the present invention include esters such as methyl (meth)acrylate, dimethyl fumarate, and dimethyl maleate; amides such as (meth)acrylamide; aryl derivatives such as aryl acetate, aryl methyl ether, and aryl phenyl ether; styrene derivatives such as styrene and α-methylstyrene; and N-substituted maleimide compounds. Further specifically, preferred examples include esterified materials of alkyl alcohols such as t-butyl alcohol and lauryl alcohol with a (meth)acrylic acid; di(meth)acrylates such as ethylene glycol di(meth)acrylate, diethylene glycol di(meth)acrylate, 1,3-butylene glycol di(meth)acrylate, tripropylene glycol di(meth)acrylate, 1,4-butanediol di(meth)acrylate, neopentyl glycol di(meth)acrylate, 1,6-hexanediol di(meth)acrylate, 1,9-nonanediol di(meth)acrylate, and polyethylene glycol di(meth)acrylate; trifunctional ethylenically unsaturated compounds such as trimethylolpropane tri(meth)acrylate; tetrafunctional ethylenically unsaturated compounds such as pentaerythritol tetra (meth)acrylate; amide derivatives such as diacetone acrylamide and (meth)acrylamide; styrene derivatives such as styrene, vinyltoluene, and divinylbenzene; allyl esters such as diallyl phthalate and triallyl cyanurate; fumarates or maleates such as diethyl fumarate, dibutyl fumarate, dioctyl fumarate, distearyl fumarate, butyl octyl fumarate, diphenyl fumarate, dibenzyl fumarate, dibutyl maleate, dioctyl maleate, bis(3-phenylpropyl) fumarate, dilauryl fumarate, and dibehenyl fumarate; and N-substituted maleimides such as N-n-hexylmaleimide, N-cyclohexylmaleimide, N-n-octylmaleimide, N-2-ethylhexylmaleimide, N-n-decylmaleimide, and N-n-laurylmaleimide.

The component (c) can be used singly or in combinations of two or more, and preferred specific examples include a mixture of 1,6-hexanediol diacrylate and 1,6-hexanediol dimethacrylate, a mixture of 1,6-hexanediol diacrylate and trimethylpropane triacrylate. Solvent resistance, image properties, and physical strength can be improved by blending the component (c).

The blending amount of the component (c) is preferably in the range of from 1.0 to 30.0% by mass, more preferably from 5.0 to 10.0% by mass. If it is less than 1.0% by mass, crosslinking density will decrease, thereby reducing physical strength, and if it exceeds 30.0% by mass, impact resilience will be poor. Therefore, these blending amounts are not preferred.

(1-4) Component (d)

Specific examples of the component (d) include a benzoin derivative which is a known compound that undergoes α-cleavage or a hydrogen-withdrawing benzophenone derivative. Further specifically, preferred examples include benzoin methyl ether, benzoin ethyl ether, benzoin isopropyl ether, benzoin dimethyl ketal, a benzophenone-dimethylethanolamine mixture, and a thioxanthone-dimethylethanolamine mixture. In addition, those generally known as a photopolymerization initiator can be used. Examples of such an initiator include aromatic ketones such as benzophenone; benzoin ethers such as benzoin methyl ether, benzoin ethyl ether, benzoin isopropyl ether, α-methylolbenzoin methyl ether, α-methoxybenzoin methylether, and 2,2-diethoxyphenylacetophenone; substituted and unsubstituted polynuclear quinones; 1-hydroxycyclohexyl phenyl ketone, 2,2-dimethoxy-1,2-diphenylethan-1-one, 2-methyl-1-[4-(methylthio)phenyl]-morpholinopropan-1-one, 2-benzyl-2-dimethylamino-1-(4-morpholinophenyl)-butan-1-one, 2-hydroxy-2-methyl-1-phenylpropan-1-one, 2,4,6-trimethylbenzoyldiphenylphosphine oxide, 1-[4-(2-hydroxyethoxy)phenyl]-2-hydroxy-2-methyl-1-propan-1-one, 2,4-diethylthioxanthone, 2-chlorothioxanthone, 2,4-dimethylthioxanthone, 3,3-dimethyl-4-methoxybenzophenone, benzophenone, 1-chloro-4-propoxythioxanthone, 1-(4-isopropylphenyl)-2-hydroxy-2-methylpropan-1-one, 1-(4-dodecylphenyl)-2-hydroxy-2-methylpropan-1-one, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 2-ethylhexyl 4-dimethylaminobenzoate, 2-isoamyl 4-dimethylaminobenzoate, 2,2'-diethoxyacetophenone, benzyl dimethyl ketal, benzyl-β-methoxyethyl acetal, methyl o-benzoylbenzoate, bis(4-dimethylaminophenyl)ketone, 4,4'-bis(diethylamino)benzophenone, 4,4'-dichlorobenzophenone, benzil, benzoin, benzoin methyl ether, benzoin ethyl ether, benzoin isopropyl ether, benzoin n-butyl ether, benzoin isobutyl ether, p-dimethylamino acetophenone, p-tert-butyl trichloroacetophenone, p-tert-butyl dichloroacetophenone, 2-(o-chlorophenyl)-4,5-diphenylimidazolyl dimer, thioxanthone, 2-methylthioxanthone, 2-isopropylthioxanthone, dibenzosuberone, α,α-dichloro-4-phenoxyacetophenone, pentyl-4-dimethylamino benzoate, 9-phenylacridine, 1,7-bis-(9-acridinyl)heptane, 1,5-bis-(9-acridinyl)pentane, and 1,3-bis-(9-acridinyl)propane.

The blending amount of the component (d) is preferably in the range of from 0.1 to 10.0% by mass, more preferably from 1.0 to 3.0% by mass. If it is less than 0.1% by mass, crosslinking density will decrease, thereby reducing physical strength. If it exceeds 10.0% by mass, absorption of light in the effective active irradiation region will increase, thereby reducing image properties.

(1-5) Optional Components

In addition to the essential ingredients (a) to (d) as described above, a plasticizer, an ultraviolet absorber, a polymerization inhibitor, pigment, inorganic particulates, and the like can be optionally added to the photosensitive resin composition for flexographic printing according to the present invention. Examples include hydrocarbon oil such as naphthene oil and paraffin oil, low-molecular polystyrene having a molecular weight of 3,000 or less, petroleum resin, polyisoprene, poly(2,3-dimethyl-1,3-butadiene), poly(1,3-pentadiene), poly(2-methyl-1,3-pentadiene), poly(1,3-hexadiene), poly(4,5-diethyl-1,3-octadiene), poly(3-butyl-1,3-octadiene), 1,2-polybutadiene, and 1,4-polybutadiene. The polypentadiene or the like is useful for adjusting hardness of the lithographic plate and improving the processability during forming.

(2) The Photosensitive Resin Plate Material for Flexographic Printing

Next, the photosensitive resin plate material for flexographic printing according to the present invention will be described.

The photosensitive resin plate material of the present invention consists of at least a support and the photosensitive resin composition of the present invention.

A plastic sheet, an aluminum plate, and the like can be used as a support, and preferred examples include a polyethylene terephthalate film, a urethane film, a polyethylene film, and a polypropylene film. Among these, a polyethylene terephthalate film is preferably used.

Figure 2:
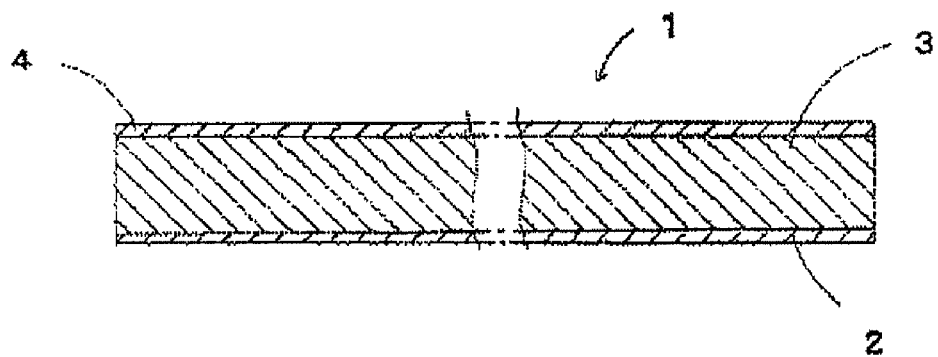
FIG. 2 is an A-A' sectional view in FIG. 1.

In a preferred embodiment, the photosensitive resin plate material for flexographic printing according to the present invention has a three-layer structure. FIG. 1 shows a perspective view of the photosensitive resin plate material of the present invention having such a three-layer structure, and FIG. 2 shows an A-A' sectional view in FIG. 1. In FIGS. 1 and 2, reference numeral (1) denotes the photosensitive resin plate material of the present invention having a three-layer structure; reference numeral (2) denotes a support; reference numeral (3) denotes the photosensitive resin composition of the present invention; and reference numeral (4) denotes a cover film. The cover film is effective in improving platemaking workability and protection and abrasion prevention of a printing plate surface. Further, a slip layer, a protective layer, or a UV shielding layer comprising an infrared-susceptible substance which can be ablated by an infrared laser is generally provided between the photosensitive resin composition (3) of the present invention and the cover film (4).

In FIGS. 1 and 2, the thickness of the support (2) is preferably from 75 to 200 μm, more preferably from 100 to 200 μm. The thickness of the photosensitive resin composition (3) is preferably from 0.5 to 10.0 mm, more preferably from 1.0 to 9.0 mm. The thickness of the cover film (4) is preferably from 75 to 200 μm, more preferably from 100 to 200 μm.

There will be described below a series of steps for producing the photosensitive resin plate material for flexographic printing using the photosensitive resin composition for flexographic printing according to the present invention.

The plate material can be produced by a method including kneading the photosensitive resin composition for flexographic printing according to the present invention which comprises at least the essential ingredients (a) to (d) at a temperature from 90 to 150° C., preferably from 110 to 140° C., for 40 to 90 minutes, preferably for 40 to 60 minutes, and then extruding and processing the kneaded composition with a hot press.

EXAMPLES

The present invention will be described in more detail based on Examples, but the present invention is not limited to the following Examples.

Examples 1 to 4 and Comparative Examples 1 to 3

Production of a Photosensitive Resin Plate Material

A kneader is charged with 65 parts by mass of a thermoplastic elastomer SBS (Kraton D-KX405CP, manufactured by Kraton Performance Polymers Inc.), 25 parts by mass of a plasticizer consisting of composition of Table 1 below, 5.5 parts by mass of 1,6-hexanediol diacrylate as an acrylic monomer, 0.5 parts by mass of 1,6-hexanediol dimethacrylate, and 1.5 parts by mass of 2,2-dimethoxy-1,2-diphenylethan-1-one as a photopolymerization initiator, and these components are kneaded at a temperature from 110 to 140° C. for 60 minutes. The thus-prepared photosensitive resin composition was introduced from a feeding port of an extrusion machine in which the barrel temperature was kept at 120° C. through a volumetric feeder kept at 120° C. The photosensitive composition discharged from a nozzle was sandwiched between a cover film (a PET film which was previously coated with a 4-μm release agent of a polyamide-based resin) and a support (a PET film which was previously coated with a urethane-based adhesive) and passed through a gap between a pair of rolls for forming, the gap being previously set so as to attain the plate thickness, thereby forming the composition into a sheet form. The resulting sheet was cooled and then cut to a predetermined size to obtain the photosensitive resin plate material.

TABLE 1

|  | Liquid 1,2-polybutadiene | Acrylic-terminated liquid 1,2-polybutadiene | Petroleum-based hydrocarbon | Liquid paraffin |
|---|---|---|---|---|
| Comparative Example 1 | 0% | 0% | 100% | 0% |
| Comparative Example 2 | 0% | 0% | 0% | 100% |
| Comparative Example 3 | 100% | 0% | 0% | 0% |
| Example 1 | 75% | 25% | 0% | 0% |
| Example 2 | 50% | 50% | 0% | 0% |
| Example 3 | 25% | 75% | 0% | 0% |
| Example 4 | 0% | 100% | 0% | 0% |

*Liquid 1,2-polybutadiene: NISSO PB B-1000, manufactured by Nippon Soda Co., Ltd.
*Acrylic-terminated liquid 1,2-polybutadiene: NISSO PB EA-3000 (viscosity: 12 Pa · S (45° C.), number average molecular weight: 4,600 (GPC method), M(1)/[M(1) + M(2)] = 0.86), manufactured by Nippon Soda Co., Ltd.
*Petroleum-based hydrocarbon: SUNPURE N-90, manufactured by Japan Sun Oil Company Ltd.
*Liquid paraffin: MORESCO-WHITE (registered trademark) P-70, manufactured by MORESCO Corporation (Evaluation of Solvent Resistance)

The photosensitive resin plate was subjected to back exposure for 25 seconds from the support side by means of JE-AO-SH (exposure unit: manufactured by Nihon Denshi Seiki Co., Ltd.) in which 32 pieces of JL-40SPRC (chemical light: manufactured by Nihon Denshi Seiki Co., Ltd.) were installed. Subsequently, the cover film was removed, and a solid negative film was adhered with vacuum to the photosensitive resin layer, which was then exposed for 10 minutes from the negative film side with the same chemical light. Then, the photosensitive resin plate was washed with Luna-Solve II (manufactured by Nihon Denshi Seiki Co., Ltd.) as a developer using JW-AO-SDR (rotary washer: manufactured by Nihon Denshi Seiki Co., Ltd.), dried anew for 30 minutes in an oven heated at 60° C., and subjected to surface treatment and postexposure for 10 minutes simultaneously by means of JEF-A0-S (GL) (surface treatment and postexposure apparatus: manufactured by Nihon Denshi Seiki Co., Ltd.).

Next, the photosensitive resin plate treated on the above platemaking conditions was cut into test pieces each having a size of 5.0 cm in length×5.0 cm in width, which was allowed to stand in a beaker filled with ethyl acetate having a liquid temperature of 25.7° C. The mass increase rate of the test piece was measured for each hour until five hours elapsed. A test piece having a smaller mass increase rate was considered more resistant to the solvent. The mass increase rate of the test piece is shown in Table 2.

TABLE 2

| | Mass increase rate | | | | | | |
|---|---|---|---|---|---|---|---|
| Immersion time (h) | Comparative Example 1 | Comparative Example 2 | Comparative Example 3 | Example 1 | Example 2 | Example 3 | Example 4 |
| 0 | 0% | 0% | 0% | 0% | 0% | 0% | 0% |
| 1 | 21.05% | 19.22% | 20.88% | 17.94% | 16.28% | 13.92% | 12.45% |
| 2 | 30.88% | 29.82% | 30.66% | 26.48% | 23.76% | 20.57% | 18.46% |
| 3 | 39.23% | 38.00% | 38.16% | 33.00% | 30.06% | 26.05% | 22.94% |
| 4 | 45.15% | 43.87% | 44.38% | 38.21% | 35.71% | 30.49% | 27.22% |
| 5 | 50.16% | 48.50% | 49.19% | 42.62% | 39.59% | 34.20% | 30.76% |

The results in Table 2 showed that the resin plate of Example 4 had the smallest mass increase rate compared with those of Comparative Examples 1 to 3 and Examples 1 to 3 and was stable to the solvent.

Comparative Examples 4 to 7

The resin plates were prepared and evaluated for solvent resistance in the same manner as in Examples 1 to 4 except that BAC-45 (acrylic-terminated 1,4-polybutadiene, manufactured by Osaka Organic Chemical Industry Ltd.) was used in a proportion as shown in Table 3 instead of the acrylic-terminated liquid polybutadiene of Examples 1 to 4. The results are shown in Table 4.

TABLE 3

|  | B-1000 | BAC-45 |
|---|---|---|
| Comparative Example 4 | 75% | 25% |
| Comparative Example 5 | 50% | 50% |
| Comparative Example 6 | 25% | 75% |
| Comparative Example 7 | 0% | 100% |

TABLE 4

| | Mass increase rate | | | |
|---|---|---|---|---|
| Immersion time (h) | Comparative Example 4 | Comparative Example 5 | Comparative Example 6 | Comparative Example 7 |
| 0 | 0% | 0% | 0% | 0% |
| 1 | 22.41% | 20.33% | 18.62% | 16.87% |
| 2 | 30.18% | 27.55% | 26.09% | 24.01% |
| 3 | 36.95% | 34.31% | 32.15% | 30.00% |
| 4 | 42.29% | 39.95% | 37.64% | 35.94% |
| 5 | 47.02% | 43.76% | 41.77% | 39.95% |

As apparent from the results in Table 4, the resin plates of Examples using the acrylic-terminated 1,2-polybutadiene have a lower mass increase rate than those of Comparative Examples using the acrylic-terminated 1,4-polybutadiene, and can be said to be better in solvent resistance.

Examples 5 and 6 and Comparative Examples 8 to 10

A disk-shaped test piece having a diameter of 11 cm was prepared in the same manner as in Examples 1 to 4. The disk-shaped test piece was fixed to a test stand of an abrasion tester manufactured by JEM, and was rotated. A wheel, the circumference of which is wound with abrasive paper, was allowed to slide on the upper surface of the test piece to wear the resin surface, and the mass reduction rate after 2000 rotations was measured. The resin plates of Comparative Examples 8 to 10 were prepared and subjected to an abrasion resistance test in the same manner as in Examples 5 and 6 except that BAC-45 (acrylic-terminated 1,4-polybutadiene, manufactured by Osaka Organic Chemical Industry Ltd.) was used instead of the acrylic-terminated liquid polybutadiene of Examples 5 and 6. The results are shown in Table 5.

TABLE 5

| | Mass reduction rate | | | |
|---|---|---|---|---|
| | B-1000 | EA-3000 | BAC-45 | Mass reduction rate |
| Example 5 | 50% | 50% | — | 0.3505% |
| Example 6 | 0% | 100% | — | 0.2599% |
| Comparative Example 8 | 100% | 0% | — | 0.6730% |
| Comparative Example 9 | 50% | — | 50% | 0.4345% |
| Comparative Example 10 | 0% | — | 100% | 0.3707% |

As apparent from Table 5, the resin plates of Examples using the acrylic-terminated 1,2-polybutadiene have a lower mass reduction rate than those of Comparative Examples using the acrylic-terminated 1,4-polybutadiene, and can be said to be better in abrasion resistance.

INDUSTRIAL APPLICABILITY

The present invention can provide a photosensitive resin composition for flexographic printing having resistance to an ink comprising an organic solvent and an emulsion ink, for example, a UV-curable ink or an ink using a vegetable oil or light naphtha, excellent image reproducibility and print durability, and transparency, and can provide a photosensitive resin plate material for flexographic printing in which the photosensitive resin composition for flexographic printing is laminated.

The invention claimed is:

1. A photosensitive resin composition for flexographic printing, consisting essentially of:
   component (a): at least a thermoplastic elastomer selected from the group consisting of:
      a styrene-isoprene-styrene copolymer,
      a styrene-butadiene-styrene copolymer,
      a styrene-isoprene-butadiene-styrene copolymer,
      a styrene-ethylene-butylene-styrene copolymer,
      a styrene-ethylene-propylene-styrene copolymer, and
      a syndiotactic 1,2-polybutadiene,
   component (b): a (meth)acrylic-modified liquid polybutadiene containing 1,2-bonds in an amount of 80% or more,
   component (c): a photopolymerizable unsaturated monomer having one or more ethylenically unsaturated groups, and
   component (d): a photopolymerization initiator.

2. The photosensitive resin composition for flexographic printing according to claim 1, comprising from 18.0 to 95.0% by mass of the component (a); from 1.0 to 80.0% by mass of the component (b); from 1.0 to 30.0% by mass of the component (c); and from 0.1 to 10.0% by mass of the component (d).

3. The photosensitive resin composition for flexographic printing according to claim 1, wherein the component (b) is a liquid polybutadiene having a (meth)acrylic-modified polymer terminal and containing 1,2-bonds in an amount of 80% or more.

4. The photosensitive resin composition for flexographic printing according to claim 1, wherein the component (b) has a number average molecular weight of 200 to 100,000 and a viscosity at 45° C. of 4 Pa·s or more.

5. A photosensitive resin plate material for flexographic printing, wherein the photosensitive resin composition for flexographic printing according to claim 1 is laminated on a support surface.

6. The photosensitive resin composition for flexographic printing according to claim 2, wherein the component (b) is a liquid polybutadiene having a (meth)acrylic-modified polymer terminal and containing 1,2-bonds in an amount of 80% or more.

7. The photosensitive resin composition for flexographic printing according to claim 2, wherein the component (b) has a number average molecular weight of 200 to 100,000 and a viscosity at 45° C. of 4 Pa·s or more.

8. The photosensitive resin composition for flexographic printing according to claim 3, wherein the component (b) has a number average molecular weight of 200 to 100,000 and a viscosity at 45° C. of 4 Pa·s or more.

9. The photosensitive resin composition for flexographic printing according to claim 6, wherein the component (b) has a number average molecular weight of 200 to 100,000 and a viscosity at 45° C. of 4 Pa·s or more.

10. A photosensitive resin plate material for flexographic printing, wherein the photosensitive resin composition for flexographic printing according to claim 2 is laminated on a support surface.

11. A photosensitive resin plate material for flexographic printing, wherein the photosensitive resin composition for flexographic printing according to claim 3 is laminated on a support surface.

12. A photosensitive resin plate material for flexographic printing, wherein the photosensitive resin composition for flexographic printing according to claim 4 is laminated on a support surface.

13. A photosensitive resin plate material for flexographic printing, wherein the photosensitive resin composition for flexographic printing according to claim 6 is laminated on a support surface.

14. A photosensitive resin plate material for flexographic printing, wherein the photosensitive resin composition for flexographic printing according to claim 7 is laminated on a support surface.

15. A photosensitive resin plate material for flexographic printing, wherein the photosensitive resin composition for flexographic printing according to claim 8 is laminated on a support surface.

16. A photosensitive resin plate material for flexographic printing, wherein the photosensitive resin composition for flexographic printing according to claim 9 is laminated on a support surface.

* * * * *